United States Patent
Raszka et al.

(10) Patent No.: US 10,523,194 B2
(45) Date of Patent: Dec. 31, 2019

(54) LOW LEAKAGE POWER SWITCH

(71) Applicant: Apple Inc., Cupertino, CA (US)

(72) Inventors: Jaroslav Raszka, San Jose, CA (US); Amrinder S. Barn, San Jose, CA (US); Victor Zyuban, Sunnyvale, CA (US); Shingo Suzuki, San Jose, CA (US); Ajay Kumar Bhatia, Saratoga, CA (US); Mohamed H. Abu-Rahma, Mountain View, CA (US); Shahzad Nazar, Fremont, CA (US); Greg M. Hess, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 119 days.

(21) Appl. No.: 15/717,276

(22) Filed: Sep. 27, 2017

(65) Prior Publication Data
US 2019/0097622 A1    Mar. 28, 2019

(51) Int. Cl.
| | |
|---|---|
| *H03K 17/16* | (2006.01) |
| *H03K 17/14* | (2006.01) |
| *H03K 19/00* | (2006.01) |
| *H03K 19/003* | (2006.01) |

(52) U.S. Cl.
CPC ......... *H03K 17/162* (2013.01); *H03K 17/145* (2013.01); *H03K 19/0016* (2013.01); *H03K 19/00369* (2013.01); *H03K 2217/0027* (2013.01); *H03K 2217/0036* (2013.01)

(58) Field of Classification Search
None
See application file for complete search history.

(56) References Cited

U.S. PATENT DOCUMENTS

| | | | |
|---|---|---|---|
| 7,053,692 B2 | 5/2006 | Parris | |
| 8,395,440 B2 | 3/2013 | Sandhu | |
| 9,110,643 B2 * | 8/2015 | Idgunji | H03K 19/00369 |
| 9,660,513 B2 * | 5/2017 | Kataoka | H02M 1/36 |
| 2011/0314317 A1 * | 12/2011 | Gajjewar | H03K 5/08 |
| | | | 713/340 |
| 2012/0113737 A1 * | 5/2012 | Lee | G11C 5/147 |
| | | | 365/226 |
| 2015/0116030 A1 * | 4/2015 | Jarrar | H03K 17/162 |
| | | | 327/536 |
| 2016/0164513 A1 * | 6/2016 | Ham | H03K 17/223 |
| | | | 327/536 |
| 2017/0162239 A1 * | 6/2017 | Yamashiro | G05F 1/625 |
| 2017/0250679 A1 * | 8/2017 | Abe | B41J 2/04593 |
| 2019/0043969 A1 * | 2/2019 | Wood | H01L 29/7322 |

* cited by examiner

*Primary Examiner* — Lincoln D Donovan
*Assistant Examiner* — Khareem E Almo
(74) *Attorney, Agent, or Firm* — Kowert, Hood, Munyon, Rankin & Goetzel, P.C.

(57) ABSTRACT

A power switch control circuit is disclosed. A sensor circuit may determine a leakage current of a power switch coupled to a power supply signal and a power terminal of a circuit block. The power switch may be configured to selectively couple or decouple the circuit block from the power supply signal using a switch control signal. The switch control circuit may, in response to receiving a request to open the power switch, determine a target voltage level that is greater than a voltage level of the power supply signal for the switch control signal using the leakage current, and transition the switch control signal from an initial voltage to the target voltage level.

18 Claims, 10 Drawing Sheets

LOW LEAKAGE POWER SWITCH

BACKGROUND

Technical Field

The embodiments disclosed herein relate to power management and control in an integrated circuit, specifically the use of power switches for power gating.

Description of the Relevant Art

Integrated circuits may include multiple circuit blocks designed to perform various functions. For example, an integrated circuit may include a memory circuit block configured to store multiple program instructions, and a processor or processor core configured to retrieve the program instructions from the memory, and execute the retrieved instructions.

In some integrated circuits, different circuit blocks or different portions of a particular circuit block may operate using different power supply voltage levels. Circuit blocks or portions of circuits blocks operating using a common power supply voltage level may be referred as being included in a common power domain. In some integrated circuits, the different power supply voltage levels used within the such integrated circuits may be generated by a Power Management Unit (commonly referred to as a "PMU") or other suitable circuits. Such PMUs may include voltage regulator circuits and supporting control circuits configured to generate the desired power supply voltage levels.

During operation of an integrated circuit, some circuit blocks or portions of a particular circuit may be unused for periods of time. To reduce power dissipation of the integrated circuit, the unused circuit blocks or portions of the particular circuit block may be decoupled from the power supply. When it is determined that a currently unused circuit block is to return to an active state, the currently unused circuit block is coupled to the power supply prior to resuming operation.

SUMMARY OF THE EMBODIMENTS

Various embodiments of a power management system are disclosed. Broadly speaking, an apparatus and a method are contemplated, in which a power switch is coupled to a power terminal of a circuit block and a power supply signal, and may be configured to selectively couple to decouple the circuit block from the power supply signal using a switch control signal. A sensor circuit may be configured to determine a leakage current of the power switch, and a switch control circuit may be configured to, in response to receiving a request to open the power switch, determine a first target voltage, greater than a voltage level of the power supply signal, for the switch control signal using the leakage current, and transition a voltage level of the switch control signal from an initial voltage to the first target voltage level.

In one embodiment, the sensor circuit may be further configured to determine a resistance of the power switch. The switch control circuit may be further configured to, in response to receiving a request to close the power switch, determine a second target voltage level, less than a ground voltage level, for the switch control signal based on the resistance, and transition the switch control signal from the first target voltage level to the second target voltage level.

In another non-limiting embodiment, the sensor circuit may be further configured to measure a rate of change of the switch control signal. The switch control circuit may be further configured to transition the voltage level of the switch control signal from the first target voltage to the second target voltage using data indicative of the rate of change of the switch control signal.

Figure 1:
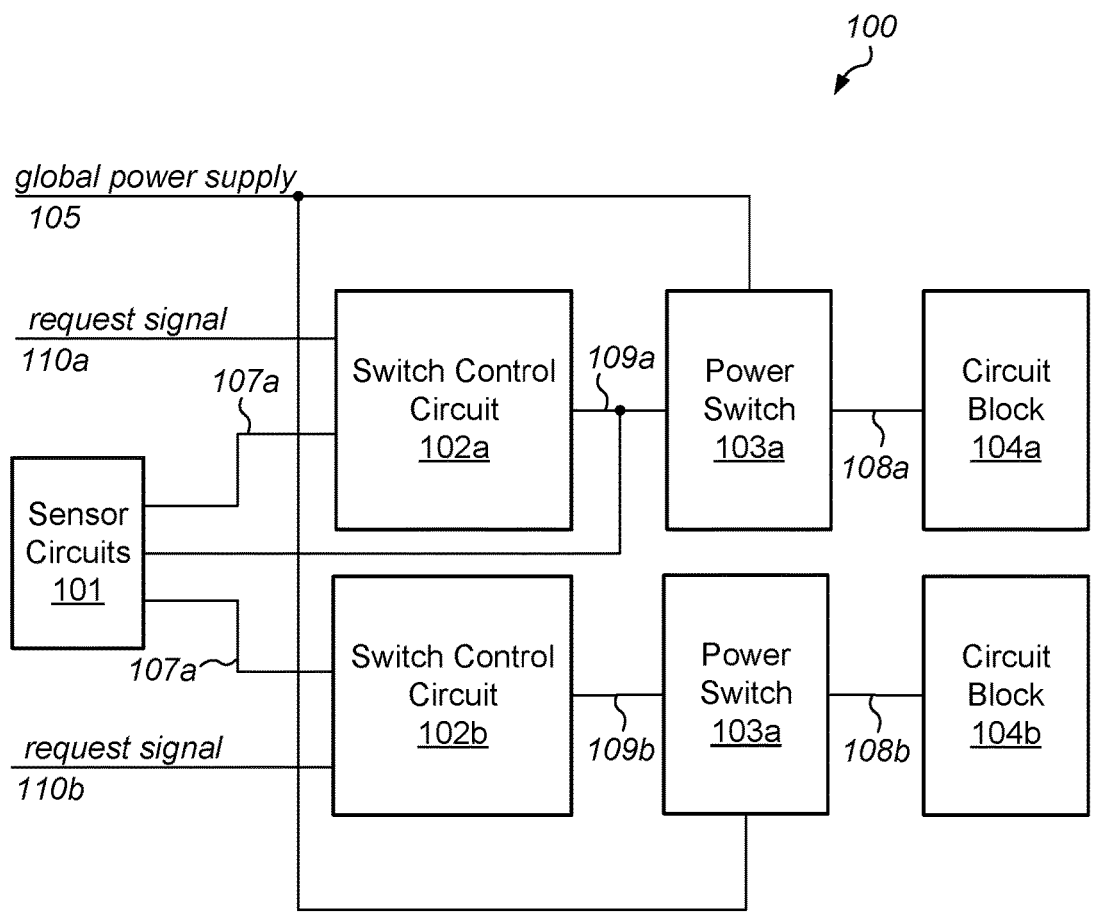
FIG. 1 is a block diagram illustrating an embodiment of a power domain in an integrated circuit that includes power switches.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

In some computing systems, to manage power consumption, circuit blocks may be selected to be de-powered for periods of time. When a particular circuit block has been selected to be de-powered, it may be decoupled from a power supply by opening one or more power switches. If the computing system determines the particular circuit block is needed to perform a desired function or execute desired operations, the one or more power switches may be closed to couple the particular circuit block back to the power supply.

When power switches are open, a leakage current may flow through the power switch. Such leakage current is undesirable as it contributes to overall power consumption and, in mobile computing applications, can reduce battery life. The embodiments illustrated in the drawings and described below may provide techniques for operating power switches while reducing the leakage current through the power switches, thereby reducing overall power consumption.

Turning to FIG. 1, an embodiment of a power domain in an integrated circuit that includes power switches is illustrated. In the illustrated embodiment, power domain 100 includes sensor circuits 101, switch control circuits 102a-b, power switches 103a-b, and circuit blocks 104a-b.

As described below in more detail, circuit blocks 104a-b may include any suitable combination of circuit configured to perform a particular function. For example, in some embodiments, a particular one of circuit blocks 104a-b may include a processor or processor core. Alternatively, in other embodiments, the particular one of circuit blocks 104a-b may include multiple data storage cells, row and column decoders, and other circuitry associated with a memory circuit.

Power switches 103a-b are coupled to local power supplies 108a-b, respectively, which are, in turn, coupled to power supply terminals (not shown) of circuit blocks 104a-b, respectively. Although, in the illustrated embodiment, a particular power switch of power switches 103a-b is depicted as being coupled to a corresponding one of circuit blocks 104a-b, in other embodiments, a power switch may be coupled to a particular portion of a particular circuit block (not shown).

As described below in more detail, power switches 103a-b may limit an amount of current that may flow from global power supply 105 to local power supplies 108a-b, respectively based on a voltage level of power switch control signals 109a-b, respectively. In the present embodiment, power switch control signals 109a-b are generated by switch control circuits 102a-b, respectively. As described below in more detail, switch control circuits 102a-b may generate control signals 109a-b based on sensor signals 107a-b, as well as request signals 110a-b. In various embodiments, a processor, power management circuit, or any other suitable circuit (all not shown) may generate request signals 110a-b.

Sensor circuits 101 may, in various embodiments, include multiple circuits each of which may be configured to sense a particular operational or electrical parameter associated with the integrated circuit. For example, in some embodiments, sensor circuits 101 may measure a rate of one or more of control signals 109a-b thereby regulating an amount of current supplied to circuit blocks that are being re-coupled to global power supply 105 after being de-coupled from the power supply. Based on the results from the multiple circuits, sensor circuits 101 may generate sensors signals 107a-b.

It is noted that the embodiment illustrated in FIG. 1 is merely an example. In other embodiments, different circuit blocks and different numbers of circuit blocks may be employed.

Figure 2:
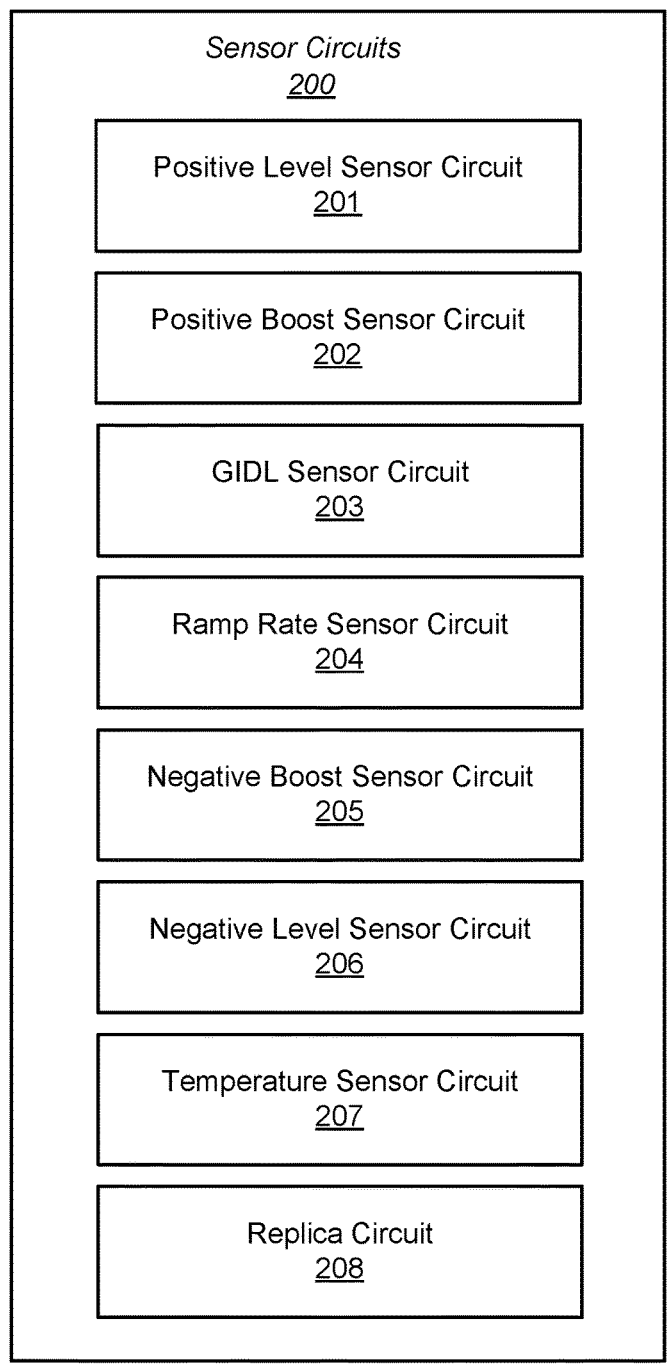
FIG. 2 is a block diagram of a sensor circuit.

As mentioned above, data indicative of operational or electrical parameters may be gathered using sensor circuits in order to determine a target voltage level for the power switch control signals. An embodiment of such sensor circuits is illustrated in FIG. 2. In various embodiments, sensor circuits 200 may correspond to sensor circuits 101 as depicted in the embodiment of FIG. 1. In the illustrated embodiment, sensor circuits 200 includes positive level sensor circuit 201, positive boost sensor circuit 202, gate-induced drain leakage (GIDL) sensor circuit 203, ramp rate sensor circuit 204, negative boost sensor circuit 205, negative level sensor circuit 206, temperature sensor circuit 207, and replica circuit 208. In various embodiments, information gathered from the individual sensors circuits may be assigned different relative priorities, and the relative priorities may be used by a switch control circuit to adjust the voltage level of the power switch control signal.

When a power switch is in an off state, the voltage level of the power switch control signal coupled to the power switch should not exceed a particular voltage value in order to maintain reliability of the switch device. To accomplish this, positive level sensor circuit 201 is configured to measure the voltage level of a power switch control signal and compare the measured voltage level against the particular voltage value. Information generated by positive level sensor circuit 201 may be used to limit the voltage level of the power switch control signal. In various embodiments, information generated by positive level sensor circuit 201 may have a higher priority in determining the voltage level of the power switch control signal than other sensor circuits, such as, positive boost sensor circuit 202 and GIDL sensor circuit 203, for example.

Positive boost sensor circuit 202 is configured to measure leakage current through a power switch when the power switch is in an off state. In some cases, positive boost sensor circuit 202 may use a replica circuit, such as, e.g., replica circuit 208, to make the measurement of the leakage current. The value of the leakage current may be compared to a threshold value, and the voltage level of the power switch control signal may be adjusted based on results of the comparison to achieve a desired level of leakage current in the off-state power switch. In some embodiments, information from the positive boost sensor circuit 202 may have a lower priority than information from GIDL sensor circuit 203 and positive level sensor circuit 201.

As described below in more detail, metal-oxide semiconductor field-effect transistors (MOSFETs) may be included in a power switch. In MOSFETs GIDL and sub-threshold conduction are two sources of leakage current. GIDL sensor circuit 203 may sense current flowing through a power switch resulting from GIDL and sub-threshold conduction. Information from GIDL sensor circuit 203 may be used to adjust the voltage level of the power switch control signal to minimize GIDL and sub-threshold conduction.

When the state of power switch is changing from an off-state to an on-state, current may flow through the power switch to provide power to circuits (commonly referred to as "inrush current") coupled to the power switch. In some cases, the amount of current that initially flows through the power switch during such a state change should be limited to prevent voltage drop of a global power supply, or other undesirable effects. Ramp rate sensor circuit 204 is configured to measure inrush current through a power switch. Information relating to the inrush current may be used to adjust the rate or change (or slope) of the power control switch signal to limit inrush current to within specified power delivery limits.

When a power switch is in an on-state, the impedance of the power switch may result in a voltage drop on the local power supply. To reduce such a drop in the voltage level of the local power supply, negative boost sensor circuit 205 may measure characteristics of the power switch indicative of the on-resistance of the power switch, such as, e.g., a voltage drop across, and current through the power switch, and based on the measured characteristics, the voltage level of the power switch control signal may be adjusted. For example, in the case of a power switch implemented with a p-channel MOSFET, the power switch control signal may be transitioned to a voltage level below ground determined by information from negative boost sensor circuit 205. As with other sensor circuits included in sensor circuits 200, a priority of negative boost sensor circuit 205 may be lower than a priority of negative level sensor circuit 206.

As with positive level sensor circuit 201, negative level sensor circuit 206 compares the voltage level of the power switch control signal to a negative threshold value. Based on results of the comparison, the voltage level of the power switch control signal may be adjusted. By adjusting the voltage level of the power switch control signal in this fashion, reliability goals for devices included in the power switch may be achieved, in various embodiments.

Temperature sensor circuit 207 is configured to measure the temperature of an integrated circuit at or near a location of a power switch. Temperature information generated by temperature sensor circuit 207 may be used to adjust the voltage level of a power switch control signal. Temperature sensor circuit 207 may be designed according to various methodologies. For example, in some embodiments, temperature sensor circuit 207 may include one or more vertical bipolar devices. Although a single temperature sensor circuit is depicted in the embodiment of FIG. 2, in other embodiments, multiple temperature sensor circuits, located at different respective locations, may be employed.

Replica circuit 208 may include one or more devices arranged in a fashion similar to a power switch. In some embodiments, voltage drops across the one or more devices or current through the one or more devices may be measured, and the resultant information used to adjust the voltage level of a power switch control signal. In various embodiments, mask design for replica circuit 208 used to generate photomasks using in a semiconductor manufacturing process, may be similar mask design of a power switch in order to mimic lithographic and manufacturing effects in the power switch.

The sensor circuits described above may be implemented according to various design styles. For example, in some embodiments, a particular sensor circuit included in sensor circuits 200 may include any suitable combination of analog, mixed-signal, logic circuits, and sequential logic circuits.

It is noted that the embodiment illustrated in FIG. 2 is merely an example. In other embodiments, different sensor circuits and different arrangements of sensor circuits may be employed.

Figure 3:
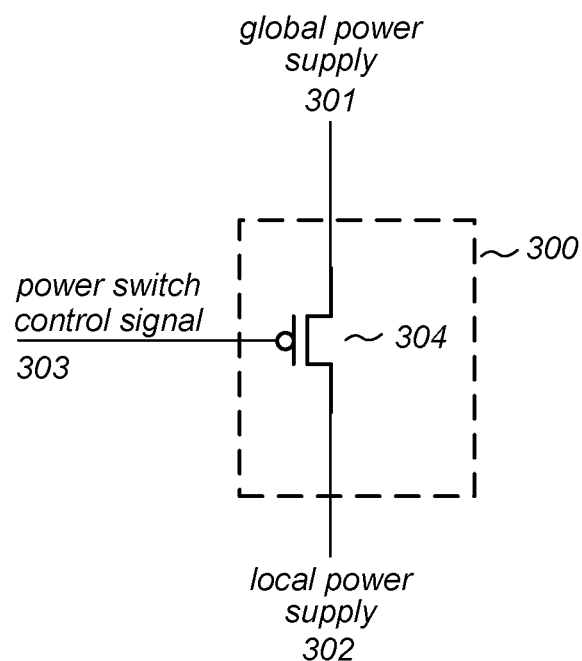
FIG. 3 illustrates a block diagram of a power switch.

Turning to FIG. 3, an embodiment of a power switch is illustrated. In the present embodiment, power switch 300 includes device 304, which is coupled to global power supply 301 and local power supply 302, and controlled by power switch control signal 303.

In various embodiments, a power management unit, or other suitable circuit, included in an integrated circuit, may generate global power supply 301. Local power supply 302 may be coupled to one or more circuit blocks, such as, circuit blocks 104a-b, as illustrated in FIG. 1, for example. It is noted that in some embodiments, the power management unit may be located on a different integrated circuit from the one or more circuit blocks.

In some embodiments, power switch control signal 303 may be generated by a switch control circuit, such as switch control circuit 400, for example. In various embodiments, a voltage level of the power switch control signal 303 may determine an amount of current than may flow through device 304. For example, in some cases, at or near ground potential may allow device 304 to conduct current from global power supply 301 to local power supply 302. Alternatively, a voltage level at or near the level of global power supply 301 may prevent device 304 from conducting current from global power supply 301 to local power supply 302.

In various embodiments, device 304 may include a p-channel metal-oxide semiconductor field effect transistor (MOSFET), or any other suitable transconductance device. Although power switch 300 is depicted as including only a single p-channel MOSFET in the embodiment of FIG. 3, in other embodiments, multiple p-channel MOSFETs or transconductance devices connected in parallel may be employed.

Figure 4:
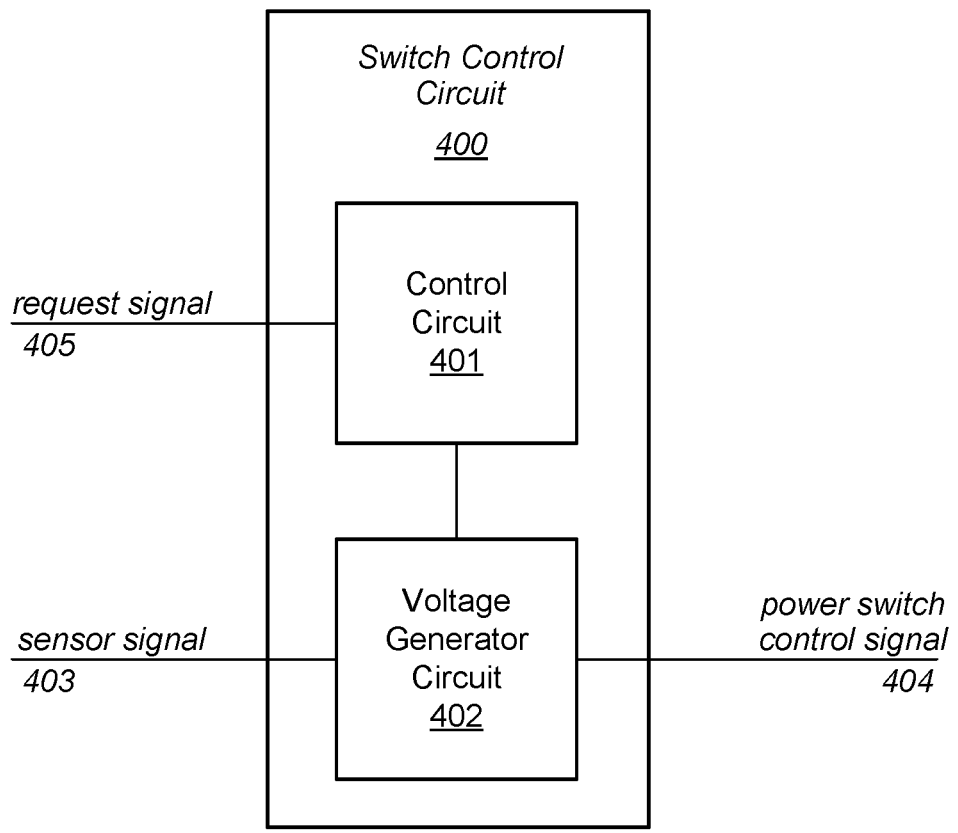
FIG. 4 is a representation of a control signal generator circuit.

Turning to FIG. 4, an embodiment of a switch control circuit is illustrated. In various embodiments, switch control circuit 400 may correspond to either of switch control circuits 102a-b as depicted in the embodiment of FIG. 1. In the illustrated embodiment, switch control circuit 400 includes control circuit 401 coupled to voltage generator circuit 402.

Control circuit 401 may include any suitable combination of logic circuit configured to control voltage generator circuit 402. In various embodiments, control circuit 401 may activate voltage generator circuit 402 based on request signal 405.

Voltage generator circuit 402 may be configured to generate power switch control signal 404, which may, in various embodiments, correspond to power switch control signals 109a-b as depicted in the embodiment of FIG. 1. In some cases, voltage generator circuit 402 may include charge pumps, boost circuits, or other circuits suitable of generator a voltage level on power switch control signal 404 greater than a global power supply voltage, or less than a ground potential. Voltage generator circuit 402 may, in various embodiments, be configured to generate the voltage level on power switch control signal 404 using sensor signals 403. In some embodiments, sensor signals 403 may correspond to sensor signals 107a-b as depicted in the embodiment of FIG. 1.

It is noted that the embodiment illustrated in FIG. 4 is merely an example. In other embodiments, different circuit blocks and different arrangements of circuit blocks are possible and contemplated.

Figure 5A:
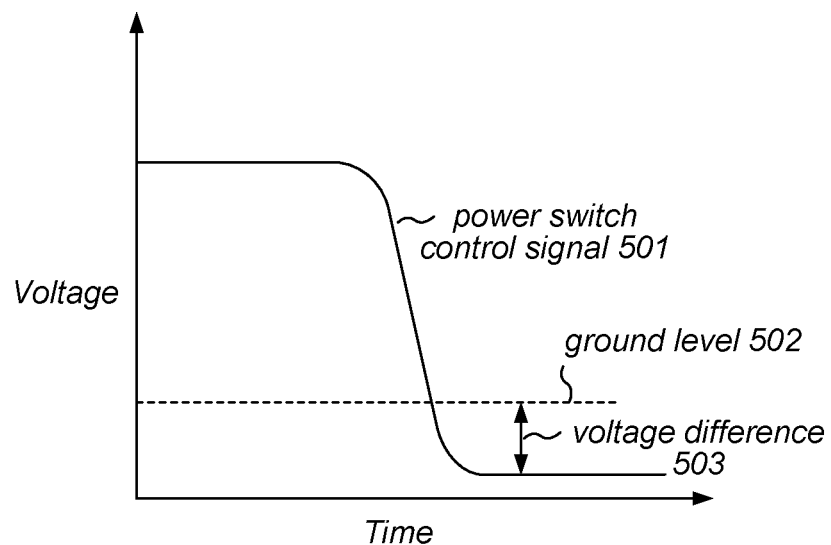
FIG. 5A illustrates a diagram depicting an example waveform associated with the operation of a control signal generator circuit.

Turning to FIG. 5A, an example waveform associated with a control signal generator circuit, such as, e.g., switch control circuit 400, closing a power switch, which includes one or more p-channel MOSFETs is illustrated. In the illustrated embodiment, power switch control signal 501 may correspond to any of power switch control signals 109*a-b* as depicted in the embodiment of FIG. 1.

Initially, power switch control signal 501 is at a voltage level at or above a voltage level of a power supply, which corresponds to the power switch being open or in an open-state. As described above, the voltage level of power switch control signal may be based on measurements made by or information from one or more sensor circuits, such as, positive level sensor circuit 201, for example.

In response to receiving a signal indicating that the power switch should be transitioned to being closed or to a closed-state, the control signal generator determines a target low voltage for power switch control signal, and begins to transition power switch control signal 501 to the target low voltage. In various embodiments, the target low voltage for power switch control signal 501 may be less than ground level 502. The difference between ground level 502 and the target low voltage of power switch control signal 501, i.e., voltage difference 503, may be based on measurements made by and/or data generated by one or more sensor circuits, such as, e.g., negative boost sensor circuit 205, for example.

In some cases, the rate of change of power switch control signal 501 from its initial high value to the target low value may be monitored by a sensor circuit, such as, ramp rate sensor circuit 204, for example. Based on results on the monitoring by the sensor circuit, the rate of change of power switch control signal 501 may be adjusted, thereby regulating inrush current through the power switch to a circuit block coupled to the power switch. By regulating inrush current in this fashion, drops in the voltage level of a power supply may be reduced.

It is noted that the waveform depicted in FIG. 5A, is merely an example. In other embodiments, the voltage levels and ramp times associated with power switch control signal 501 may be different.

Figure 5B:
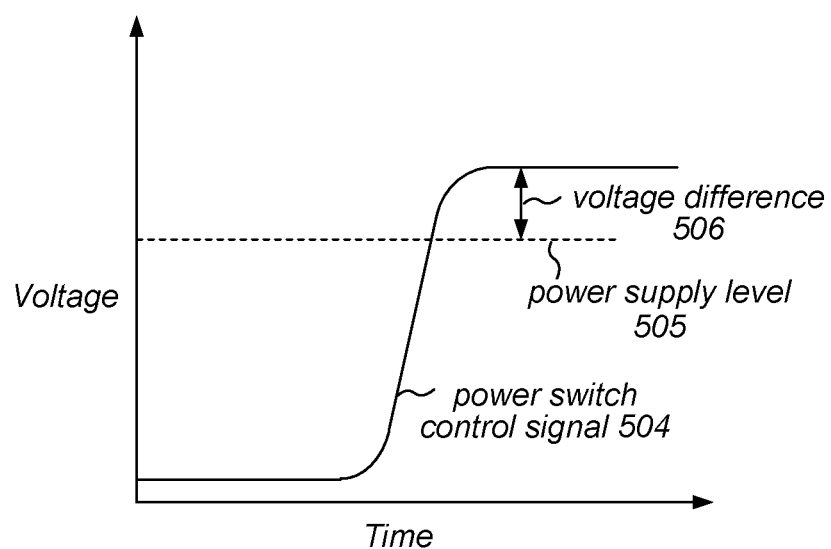
FIG. 5B illustrates a diagram depicting an additional example waveform associated with the operation of a control signal generator circuit.

Turning to FIG. 5B, an example waveform associated with a control signal generator, such as, e.g., switch control circuit 400, opening a power switch, which includes one or more p-channel MOSFETs, is illustrated. In the present embodiment, power switch control signal 504 may correspond to any of power switch control signals 109*a-b* as illustrated in the embodiment of FIG. 1.

Initially, power switch control signal 504 is at a voltage at or below ground level, which corresponds to the power switch being in a closed-state. As described above, the voltage level of power switch control signal 504 may be based on measurements by one or more sensor circuits, such as, negative level sensor circuit 206, for example. In some embodiments, the voltage level of power closed-state voltage level of power switch control signal may be based, at least in part, on leakage current flowing through the power switch.

In response to receiving a signal indicating that the power switch should be transitioned to an open-state, the control signal generator determines a target high voltage for power switch control signal 504, and begins to transition power switch control signal 504 to the target high voltage. In various embodiments, the new target voltage for power switch control signal 504 may be greater than a voltage level of power supply level 505. The difference between power supply level 505 and the target high voltage of power switch control signal 504, i.e., voltage difference 506, may be based on measurements made by and/or data generated by one or more sensor circuits, such as, e.g., positive boost sensor circuit 202, for example.

By selecting the target high voltage for power switch control signal 504 to be greater than power supply level 505, leakage current through the power switch resulting from sub-threshold conduction and/or GIDL may be reduced, thereby reducing overall power consumption of a computing system.

It is noted that the waveform depicted in FIG. 5B is merely an example. In other embodiments, the use of power switch circuits that employ different technology may result in different voltage levels than those depicted in the FIG. 5B.

As described above, during operation of an integrated circuit, circuit blocks or portions of circuit blocks that are not currently being used in the execution of a computing task may be decoupled from a corresponding internal power supply in order to reduce power consumption of the integrated circuit. To decouple such circuit blocks or portions of circuit blocks, one or more power switches coupling the circuit blocks or portions of circuit blocks to the internal power supply may be opened.

Figure 6:
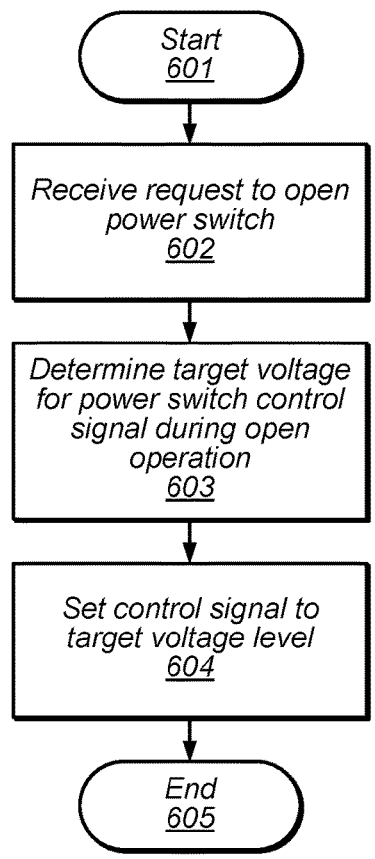
FIG. 6 is a flow diagram depicting an embodiment of a method for closing a power switch.

A flow diagram depicting an embodiment of a method for opening a power switch is depicted in FIG. 6. In the illustrated embodiment, the method begins in block 601. A request to open a power switch associated with a particular circuit block or portion of a circuit block may then be received (block 602). In various embodiments, the request may be generated by a processor or other control circuit and received by a control signal generator circuit, such as, control signal generator circuit 400 as depicted in the embodiment of FIG. 4.

In response to receiving the request, a desired voltage level for a power switch control signal generated by the control signal generator circuit may then be determined (block 603). In various embodiments, the value of the power switch control signal may be based on a desired amount of leakage current that may flow through the power switch. The temperature of the power switch, the voltage level of a global power supply coupled to the power switch, or other semiconductor process related parameters may be employed in determining the desired voltage level of the power switch control signal. In some cases, a circuit that mimic the behavior of a given power switch (commonly referred to as a "replica circuit") may be employed to determine electrical characteristics similar to those of the power switch. Such electrical characteristics may be used in determining the desired voltage level of the power switch control signal.

Once the desired voltage level for the power switch control signal has been determined, the power switch control signal may then be transitioned to the desired level (block 604). In some embodiments, the voltage level of the control signal may be transitioned from an initial voltage level to the desired voltage level over a period of time to limit sudden changes in current through multiple power switches. In some cases, the voltage level of the power switch control signal may be monitored during the transition period by a sensor circuit, such as, e.g., sensor 101 as depicted in FIG. 1. The monitored voltage level of the power switch control signal may be compared to the desired voltage level using a comparator or other suitable circuit. When the monitored voltage level of the power switch control signal is substantially equal to the desired voltage level, the control signal generator circuit may halt further changes in the voltage level of the power switch control signal.

Once the control signal has achieved the desired voltage level, the method may conclude in block 605. It is noted that the embodiment of the method illustrated in the flow diagram of FIG. 6 is merely an example. In other embodiments, different operations and different orders of operations may be employed.

When it is determined that a circuit block or portion of a circuit block that is current decoupled from its corresponding internal power supply is to be recoupled to the internal power supply, the power switches associated with the circuit block or portion of circuit block may be closed. An embodiment of a method for closing such power switches is depicted in the flow diagram of FIG. 7. The method starts in block 701.

A request to close a particular power switch may be received (block 702). The request may be received from a processor or other control circuit by a control signal generator circuit, such as, e.g., switch control circuit 400, associated with the particular power switch. In various embodiments, the request may be the result of a determination that a circuit block or portion of the circuit block coupled to the particular power switch are to be used in a task to be performed.

The desired voltage level for power switch control signals coupled to the particular power switch may then be determined (block 703). In various embodiments, the desired voltage level for the power switch control signals may be determined using data gathered from one or more sensor circuits, such as, sensor circuit 200, for example. In some cases, the desired voltage level may be based, at least in part, on a desired on-resistance associated with the particular power switch, and may be a negative voltage, i.e., a voltage level less than the potential of a ground supply.

Once the desired voltage level for the power switch control signals has been determined, the power switch control signals are set to the desired voltage level (block 704). In various embodiments, the control signal generator circuit associated with the particular power switch may monitor the rate at which the power switch control signals are transitioned to the desired voltage level. The transition of the power switch control signals to the desired voltage level may be made over a period of time in order to limit the initial current flowing through the particular switch (commonly referred to as "inrush current"), as the circuit block coupled to the particular switch is returned to a powered state. Once the power switch control signals for the particular power switch have been set to the desired voltage level, the method may conclude in block 705.

Figure 7:
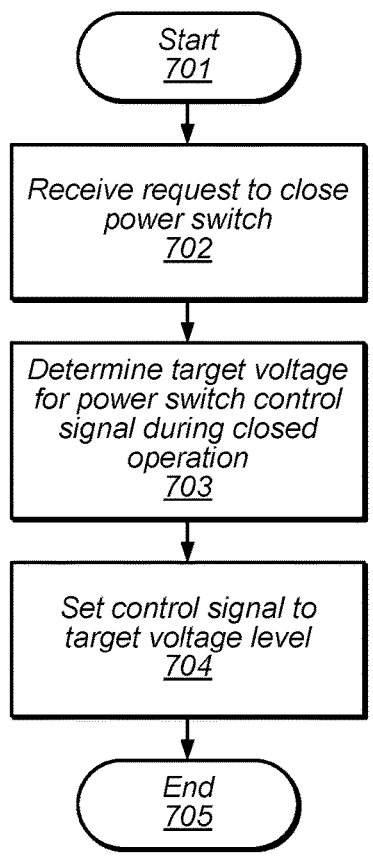
FIG. 7 is a flow diagram depicting an embodiment of a method for closing a power switch.

It is noted that the embodiment of the method illustrated in the flow diagram of FIG. 7 is merely an example. In other embodiments, different operations and different orders of operations may be employed.

In order to limit the voltage drop across a power switch, large devices may be employed to create the power switch. Such large devices may be constructed from multiple smaller devices coupled in parallel, which may result in a large load for a switch control circuit, such as, switch control circuit 102a, for example.

Figure 8:
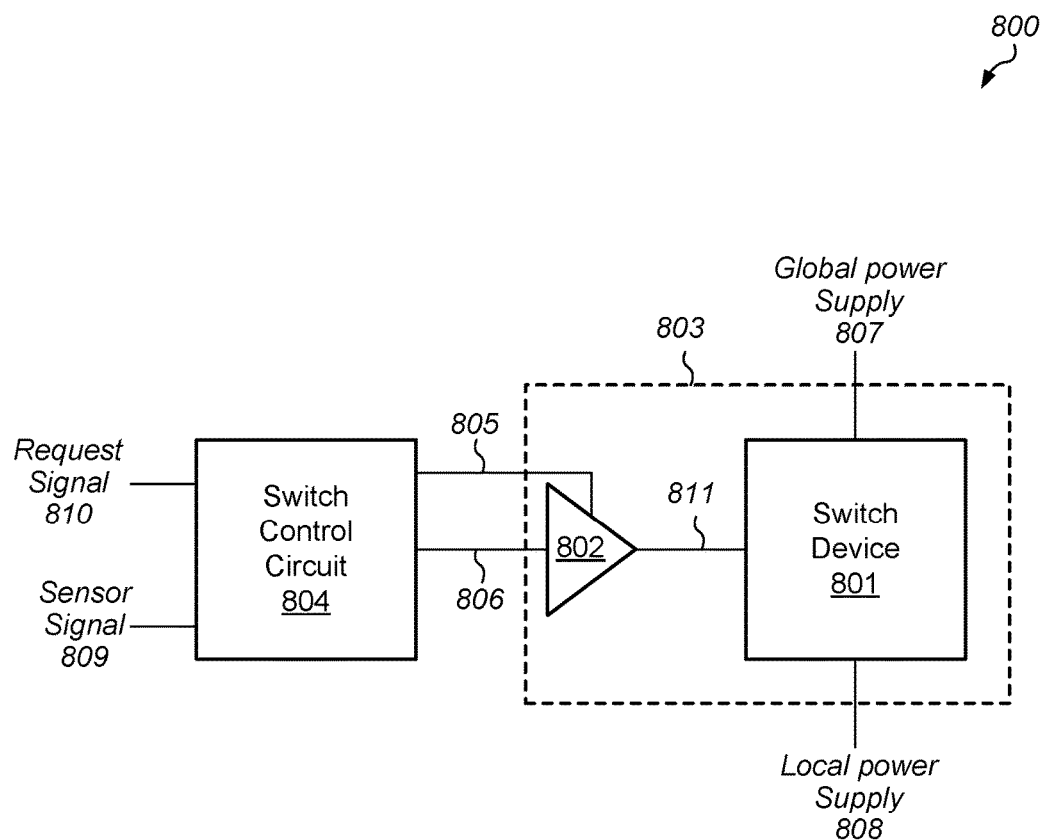
FIG. 8 illustrates a diagram depicting an embodiment of a power switch with a local buffer.

To allow for a switch control circuit to control a power switch that includes a large load, a local buffer circuit may be employed. A block diagram depicting power switch system that includes switch control circuit and associated power switch with a local buffer is illustrated in FIG. 8. In the illustrated embodiment, power switch system 800 includes switch control circuit 804 and power switch 803.

Switch device 801 may, in various embodiments, correspond to power switch 300 as depicted in the embodiment of FIG. 3, and may be configured to selectively coupled global power supply 807 to local power supply 808 using buffered switch control signal 811. In some embodiments, switch device 801 may include multiple transconductance devices, such as, e.g., MOSFETs, coupled in parallel.

Switch control circuit 804 may, in various embodiments, be similar to switch control circuit 400 as illustrated in the embodiment of FIG. 4. In the present embodiment, switch control circuit 804 generates switch control signal 806 using request signal 810 and sensor signal 809. Additionally, switch control circuit 804 generates local buffer power supply signal 805 using request signal 810 and sensor signal 809. In various embodiments, switch control signal may increase the voltage level of local buffer power supply signal 805 to be greater than the voltage level of global power supply 807. By increasing the voltage level of local buffer power supply signal 805 in such a fashion, the voltage level of buffered switch control signal 811 may be also increased above the voltage level of global power supply 807, thereby reducing leakage in switch device 801.

Local buffer 802 is configured to generate buffered switch control signal 811 using switch control signal 806 and local buffer power supply signal 805. In various embodiments, local buffer 802 may include one or more transconductance devices, such as, e.g., MOSFETs, or other suitable circuits, such as, inverters, for example. By employing local buffer 802, switch control circuit 804 can drive a larger power switch device. Although depicted as being non-inverting, in other embodiments, local buffer 802 may invert the logical sense of switch control signal 806 to generate buffered switch control signal 811. In such cases, the logical sense of switch control signal 806 may also be inverted It is noted that the embodiment of FIG. 8 is merely an example. In other embodiments, different numbers of local buffers, and different arrangements of local buffers may be employed.

Figure 9:
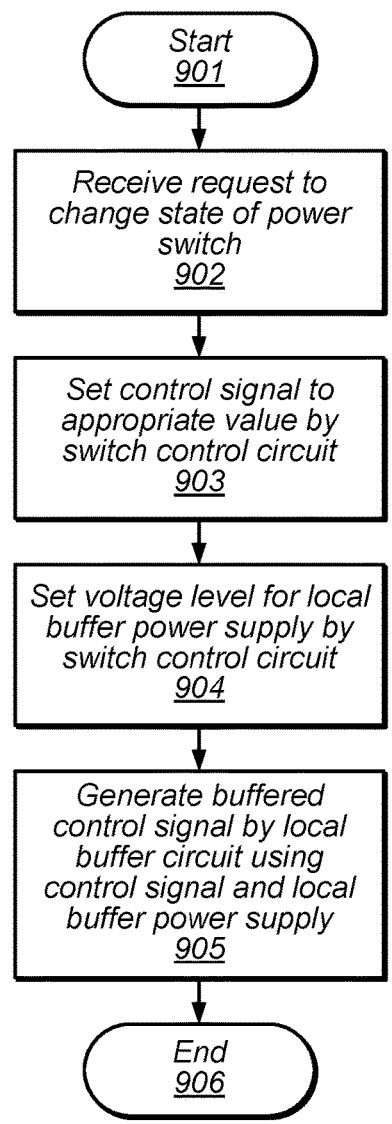
FIG. 9 is a flow diagram depicting an embodiment of a method for operating a power switch that includes a local buffer.

A flow diagram depicting an embodiment of a method for operating a power switch that includes a local buffer is illustrated in FIG. 9. Referring collectively to the embodiment depicted in FIG. 8, and the flow diagram of FIG. 9, the method begins in block 901.

Switch control circuit 804 may then receive a request to change the state of the power switch 803 via request signal 810 (block 902). If power switch 803 is closed, the request may include a request to open power switch 803, i.e., decouple global power supply 807 from local power supply 808. Alternatively, if power switch 803 is open, then the request may include a request to close power switch 803.

Switch control signal 806 may then set to an appropriate value by switch control circuit 804 (block 903). In various embodiments, switch control signal 806 may be generated based on request signal 810 and sensor signal 809 as described above in regard to FIG. 6 and FIG. 7.

The voltage level of local buffer power supply signal 805 may be set by switch control circuit 804 (block 904). In various embodiments, switch control circuit 804 may set the voltage level of local buffer power supply signal 805 to a level greater than the voltage level of global power supply 807.

Local buffer 802 may then generate buffered control signal 811 using switch control signal 806 and local buffer power supply signal 805 (block 905). The state of switch device 801 may then change according to the voltage level of buffered control signal 811. The method may then conclude in block 906.

It is noted that the embodiment depicted in the flow diagram of FIG. 9 is merely an example. In other embodiments, different operations and different arrangements of operations are possible and contemplated.

Figure 10:
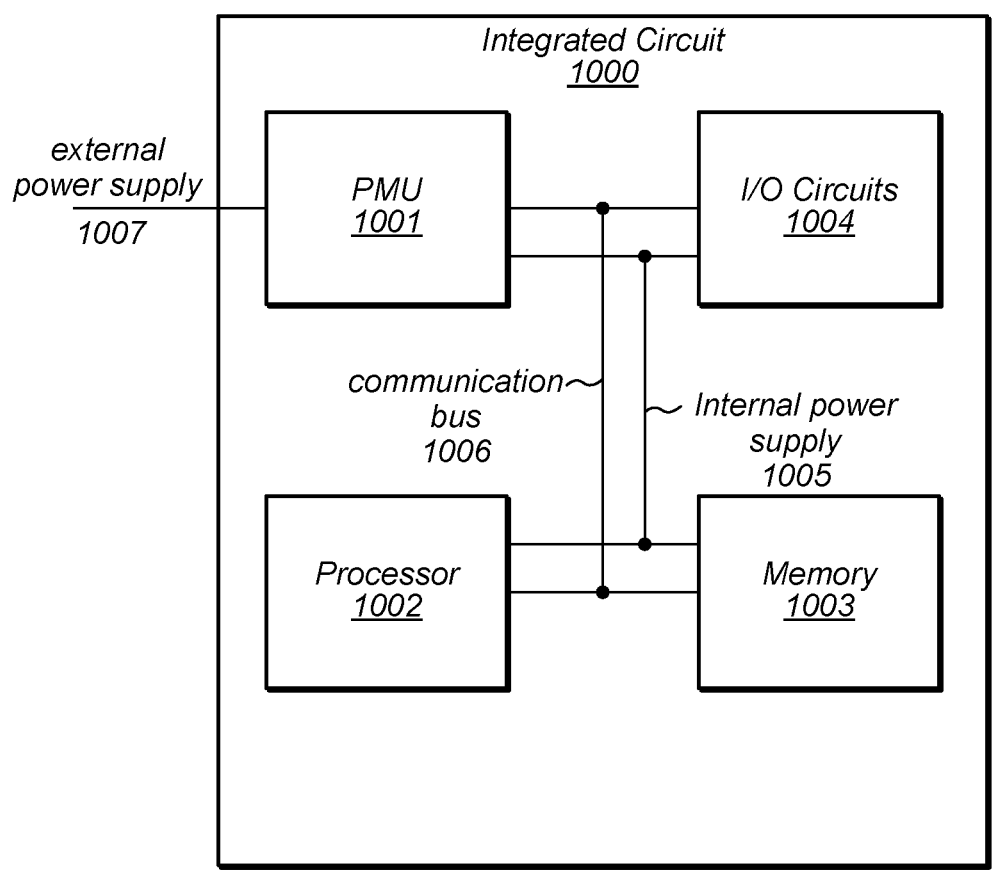
FIG. 10 is a generalized block diagram of an embodiment of an integrated circuit.

Turning to FIG. 10, an embodiment of an integrated circuit is illustrated. In the illustrated embodiment, integrated circuit 1000 includes power management unit (PMU) 1001, processor 1002, memory 1003, and input/output (I/O) circuits 1004. As described below in more detail, individual circuit blocks, such as, e.g., processor 1002, may include one or more power switches that may function as described above.

PMU 1001 may include voltage regulation and associated control circuits (not shown) configured to generate internal power supply 1005 using external power supply 1007. Although a single internal power supply is depicted in the embodiment of FIG. 10, in other embodiments, any suitable number of internal power supplies may be employed. In some cases, each internal power supply may have a different voltage level. In some embodiments, PMU 1001 may include sensor or switch control circuit, such as depicted in the embodiment of FIG. 1.

Memory 1003 may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example. It is noted that in the embodiment of an integrated circuit illustrated in FIG. 10, a single memory block is depicted. In other embodiments, any suitable number of memory blocks may be employed.

Processor 1002 may include one or more processor cores configured to execute program instructions according to a particular instruction set architecture (ISA). During execution of program instructions, Processor 1002 may retrieve the program instructions from memory 1003 using communication bus 1006. In various embodiments, communication bus 1006 may be configured to allow requests and responses to be exchanged between processor 1002, memory 1003, and I/O circuits 1004 according to a particular one of various communication protocols.

I/O circuits 1004 may be configured to coordinate data transfer between integrated circuit 1000 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O circuits 1004 may be configured to implement a version of Universal Serial Bus (USB) protocol or IEEE 1394 (Firewire®) protocol.

In various embodiments, each of the included circuit blocks, such as, e.g., processor 1002, may include one or more power switches, such as, e.g., power switch 300, sensor circuits, such as, e.g., sensor circuit 200, and control signal generator circuits, such as, switch control circuit 400, for example. During operation, the power switches may be employed to decouple a particular circuit block, or a portion thereof, from internal power supply 1005, in response to a determination that the particular circuit block, or portion thereof, will be unused for a period of time. When the particular circuit block, or portion thereof, has a task to perform, the power switches may be closed to recoupled the particular circuit, or portion thereof to internal power supply 1005.

It is noted that the embodiment illustrated in FIG. 10 is merely an example. In other embodiments, different numbers of circuit blocks, and different arrangements of circuit blocks are possible and contemplated.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An, apparatus, comprising:
a circuit block;
a power switch coupled to a power terminal of the circuit block and a power supply signal, wherein the power switch is configured to selectively couple or decouple the circuit block from the power supply signal using a switch control signal;
a sensor circuit configured to determine a leakage current of the power switch by measuring a voltage drop across a replica of the power switch; and
a switch control circuit configured to:
  receive a first request to open the power switch;
  in response to receiving the first request:
    determine a first target voltage level, greater than a voltage level of the power supply signal, for the switch control signal using the leakage current; and
    transition a voltage level of the switch control signal from an initial voltage to the first target voltage level.

2. The apparatus of claim 1, wherein the sensor circuit is further configured to determine a resistance of the power switch, and wherein the switch control circuit is further configured to:
receive a second request to close the power switch;
in response to receiving the second request:
  determine a second target voltage level, less than a ground voltage level, for the switch control signal based on the resistance; and
  transition the voltage level of the switch control signal from the first target voltage level to the second target voltage level.

3. The apparatus of claim 2, wherein the sensor circuit is further configured to measure a rate of change of the switch control signal, and wherein the switch control circuit is further configured to transition the voltage level of the switch control signal from the first target voltage level to the second target voltage level using data indicative of the rate of change of the switch control signal.

4. The apparatus of claim 1, wherein the sensor circuit is further configured to compare the voltage level of the switch control signal to a maximum voltage level.

5. The apparatus of claim 1, wherein a first mask design used to fabricate the power switch is the same as a second mask design used to fabricate the replica of the power switch.

6. The apparatus of claim 1, wherein the power switch includes at least one buffer circuit configured to generate a buffered version of the switch control signal.

7. A method, comprising:
receiving, by a switch control circuit, a first request to open a power switch coupled to a power supply signal and a power terminal of a circuit block;
selectively coupling or decoupling the circuit block and the power supply signal by the power switch using a switch control signal;
determining, by a sensor circuit, a leakage current of the power switch and a temperature of the power switch;
in response to receiving the first request:
determining a first target voltage level, greater than a voltage level of the power supply signal, for the switch control signal using the leakage current and the temperature; and
transitioning a voltage level of the switch control signal from an initial voltage to the first target voltage level.

8. The method of claim 7, further comprising:
determining, by the sensor circuit, a resistance of the power switch;
receiving a second request to close the power switch;
in response to receiving the second request:
determining a second target voltage level, less than a ground voltage level, for the switch control signal based on the resistance; and
transitioning the voltage level of the switch control signal from the first target voltage level to the second target voltage level.

9. The method of claim 8, further comprising, measuring, by the sensor circuit, a rate of change of the switch control signal, and transitioning the voltage level of the switch control signal from the first target voltage level to the second target voltage level using data indicative of the rate of change of the switch control signal.

10. The method of claim 7, further comprising, comparing, by the sensor circuit, the voltage level of the switch control signal to a maximum voltage level.

11. The method of claim 7, wherein determining, by the sensor circuit, the leakage current of the power switch, includes measuring a leakage current of a replica circuit.

12. The method of claim 7, further comprising, buffering the switch control signal by a buffer circuit.

13. A system, comprising:
a power management unit configured to generate an internal power supply signal using an external power supply signal;
a processor;
a power switch coupled to a power terminal of the processor and the internal power supply signal, wherein the power switch is configured to selectively couple or decouple the processor from the internal power supply signal using a switch control signal;
a sensor circuit configured to:
determine a leakage current of the power switch; and
measure a temperature of the power switch; and
a switch control circuit configured to:
receive a first request to open the power switch;
in response to receiving the first request:
determine a first target voltage level, greater than a voltage level of the internal power supply signal, for the switch control signal using the leakage current; and
transition a voltage level of the switch control signal from an initial voltage to the first target voltage level.

14. The system of claim 13, wherein the sensor circuit is further configured to determine a resistance of the power switch, and wherein the switch control circuit is further configured to:
receive a second request to close the power switch;
in response to receiving the second request:
determine a second target voltage level, less than a ground voltage level, for the switch control signal based on the resistance; and
transition the voltage level of the switch control signal from the first target voltage level to the second target voltage level.

15. The system of claim 14, wherein the sensor circuit is further configured to measure a rate of change of the switch control signal, and wherein the switch control circuit is further configured to transition the voltage level of the switch control signal from the first target voltage level to the second target voltage level using data indicative of the rate of change of the switch control signal.

16. The system of claim 13, wherein the sensor circuit is further configured to compare the voltage level of the switch control signal to a maximum voltage level.

17. The system of claim 13, wherein to determine the leakage current of the power switch, the sensor circuit is further configured to measure a leakage current of a replica circuit.

18. The system of claim 13, wherein the power switch includes at least on buffer circuit configured to generate a buffered version of the switch control signal.

* * * * *